US012622247B2

(12) United States Patent (10) Patent No.: US 12,622,247 B2
Ji (45) Date of Patent: May 5, 2026

(54) MANUFACTURING METHOD OF SEMICONDUCTOR STRUCTURE

(71) Applicant: NANYA TECHNOLOGY CORPORATION, New Taipei (TW)

(72) Inventor: Cheng Yan Ji, New Taipei (TW)

(73) Assignee: NANYA TECHNOLOGY CORPORATION, New Taipel (TW)

( * ) Notice: Subject to any disclaimer, the term of this patent is extended or adjusted under 35 U.S.C. 154(b) by 380 days.

(21) Appl. No.: 18/198,526

(22) Filed: May 17, 2023

(65) Prior Publication Data
US 2024/0387260 A1 Nov. 21, 2024

(51) Int. Cl.
*H01L 21/768* (2006.01)
*H01L 23/528* (2006.01)

(52) U.S. Cl.
CPC .... *H01L 21/76877* (2013.01); *H01L 21/7684* (2013.01); *H01L 21/76846* (2013.01); *H01L 21/76876* (2013.01); *H01L 21/76897* (2013.01); *H01L 23/528* (2013.01)

(58) Field of Classification Search
CPC ........... H01L 21/76877; H01L 21/7684; H01L 21/76846; H01L 21/76876; H01L 21/76897; H01L 23/528; H01L 21/76879; H01L 21/76883
See application file for complete search history.

(56) References Cited

U.S. PATENT DOCUMENTS

| | | | | | |
|---|---|---|---|---|---|
| 6,067,680 | A | * | 5/2000 | Pan | H01L 21/76877 |
| | | | | | 257/E21.585 |
| 6,225,214 | B1 | * | 5/2001 | Lin | H01L 21/76877 |
| | | | | | 257/E21.585 |
| 6,328,794 | B1 | * | 12/2001 | Brouillette | H10D 1/047 |
| | | | | | 257/E21.651 |
| 6,872,622 | B1 | * | 3/2005 | Tu | H10D 1/712 |
| | | | | | 257/E21.279 |
| 2005/0048766 | A1 | * | 3/2005 | Wu | H01L 21/28525 |
| | | | | | 257/E21.585 |
| 2006/0275997 | A1 | * | 12/2006 | Ikeda | H10D 1/716 |
| | | | | | 438/386 |
| 2010/0330801 | A1 | * | 12/2010 | Rouh | H01L 21/28525 |
| | | | | | 257/E21.585 |
| 2013/0207166 | A1 | * | 8/2013 | Chen | H01L 21/02579 |
| | | | | | 257/288 |

(Continued)

FOREIGN PATENT DOCUMENTS

CN 113594098 A * 11/2021 ........... H10B 12/315

*Primary Examiner* — Bitew A Dinke
(74) *Attorney, Agent, or Firm* — CKC & Partners Co., LLC

(57) ABSTRACT

The present disclosure provides a manufacturing method of a semiconductor structure including the following steps. A trench is formed between bit lines. A seed layer is deposited in the trench, and a first contact layer is deposited on the seed layer in the trench. A second contact layer is deposited on the first contact layer to fill the trench, in which a second doping concentration of the second contact layer is lower than a first doping concentration of the first contact layer. An annealing process is performed on the first contact layer and the second contact layer, such that dopants in the first contact layer diffuse into the second contact layer to form a contact plug including the first contact layer and the second contact layer.

19 Claims, 12 Drawing Sheets

(56)     References Cited

U.S. PATENT DOCUMENTS

| 2015/0333071 | A1* | 11/2015 | Kim | H01L 21/7682 |
| | | | | 438/510 |
| 2016/0211371 | A1* | 7/2016 | Tsai | H10D 30/796 |
| 2016/0322474 | A1* | 11/2016 | Tsai | H10D 30/797 |
| 2020/0203354 | A1* | 6/2020 | Lee | H10B 12/02 |
| 2021/0028310 | A1* | 1/2021 | Fan | H10D 30/797 |
| 2021/0074708 | A1* | 3/2021 | Huang | H10B 12/485 |
| 2022/0262721 | A1* | 8/2022 | Choi | H01L 23/528 |
| 2023/0125245 | A1* | 4/2023 | Wu | H01L 21/76877 |
| | | | | 257/655 |
| 2023/0320076 | A1* | 10/2023 | Kim | H10B 12/315 |
| | | | | 257/296 |

* cited by examiner

S100

S110 — Forming bit lines on a substrate

S120 — Forming a trench between the bit lines

S130 — Depositing a seed layer in the trench

S140 — Depositing a first contact layer on the seed layer

S150 — Depositing a second contact layer on the first contact layer to fill the trench S160 — Depositing a capping layer on the second contact layer S170 — Performing an annealing process on the first contact layer and the second contact layer to form a contact plug S180 — Performing a planarization process

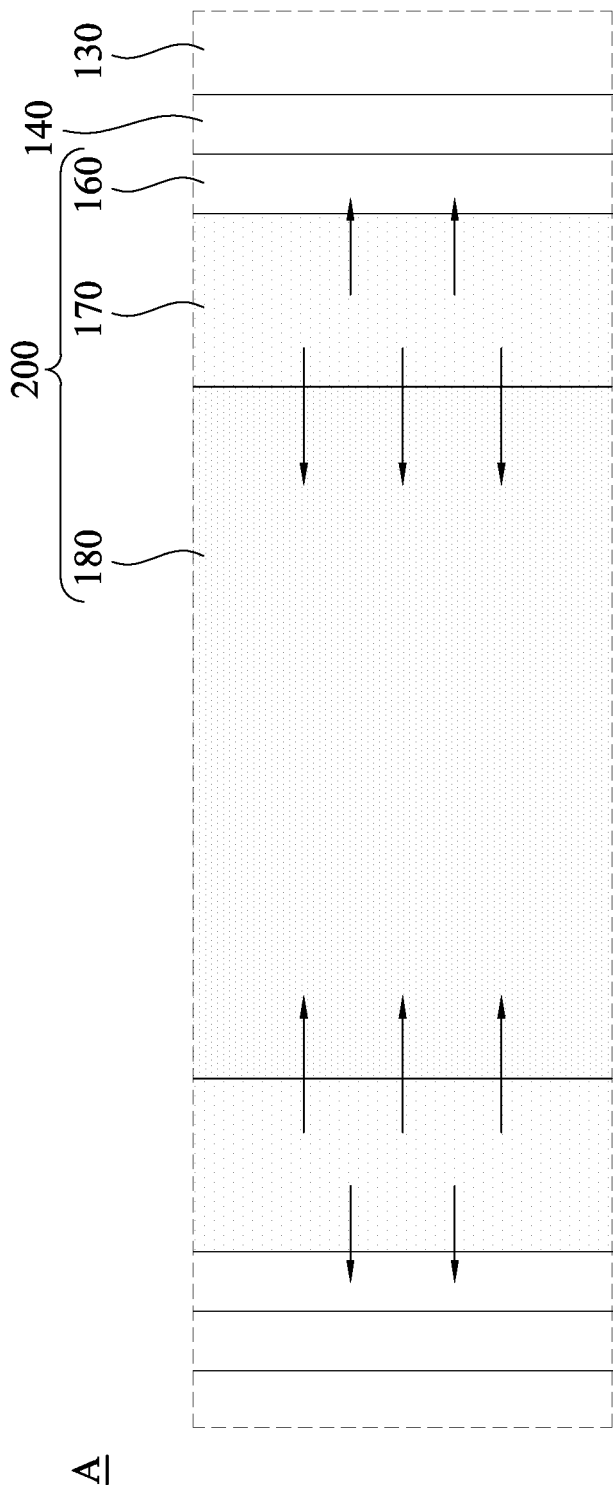
Fig. 2G
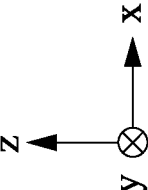

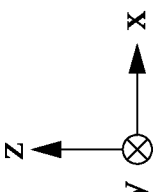
140
138
136 ⎫
       ⎬ 130
134 ⎭
132
110
100
200 ⎧ 180
    ⎨ 170
    ⎩ 160
190
120
Fig. 3
20

10

140
138
136 } 130
134
132
110
100

200 { 160 170 180

120

140
138
136 ⎬ 130
134
132
110
100
210
160 170 180 ⎤
            ⎬ 200
210
120
Fig. 4B
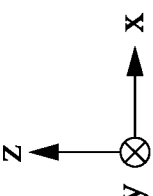

MANUFACTURING METHOD OF SEMICONDUCTOR STRUCTURE

BACKGROUND

Field of Invention

The present disclosure relates to a manufacturing method of a semiconductor structure. More particularly, the present disclosure relates to the manufacturing method of a contact plug of the semiconductor structure.

Description of Related Art

With the advancement of semiconductor techniques, the size of semiconductor structure has become smaller, which has led to an increase in the integration of semiconductor devices. In this case, the critical dimension of the semiconductor structure is also reduced, so that the electronic product may be more compact. However, as the critical dimension of the semiconductor structure gets smaller, the process techniques for manufacturing the semiconductor structure will face many challenges. For example, since the semiconductor structures have become smaller, the requirement for fewer voids therein became higher to achieve the expected yield and performance.

SUMMARY

According to an embodiment of the present disclosure, a manufacturing method of a semiconductor structure is provided. A trench is formed between bit lines. A seed layer is deposited in the trench, and a first contact layer is deposited on the seed layer in the trench. A second contact layer is deposited on the first contact layer to fill the trench, in which a second doping concentration of the second contact layer is lower than a first doping concentration of the first contact layer. An annealing process is performed on the first contact layer and the second contact layer, such that dopants in the first contact layer diffuse into the second contact layer to form a contact plug including the first contact layer and the second contact layer.

In some embodiments, the first doping concentration of the first contact layer before performing the annealing process is higher than a doping concentration of the contact plug after performing the annealing process.

In some embodiments, the seed layer is undoped before performing the annealing process.

In some embodiments, after performing the annealing process, the dopants in the first contact layer diffuse into the seed layer to form the contact plug including the seed layer.

In some embodiments, the seed layer, the first contact layer, and the second contact layer have a uniform doping concentration after performing the annealing process.

In some embodiments, a thickness of the first contact layer is larger than a thickness of the seed layer, and a thickness of the second contact layer is larger than the thickness of the first contact layer.

In some embodiments, a ratio of a thickness of the second contact layer to a thickness of the first contact layer is in a range of 1.3 to 3.1.

In some embodiments, the seed layer, the first contact layer, and the second contact layer are formed of a same polysilicon material.

In some embodiments, the manufacturing method further includes depositing a capping layer on the second contact layer after depositing the second contact layer and before performing the annealing process. A third doping concentration of the capping layer is lower than the second doping concentration of the second contact layer.

In some embodiments, the second contact layer includes a recessed portion at a top surface of the second contact layer, and the capping layer fills the recessed portion.

In some embodiments, the capping layer has a flat top surface after depositing the capping layer.

In some embodiments, a thickness of the capping layer is larger than a thickness of the second contact layer.

In some embodiments, the manufacturing method further includes performing a planarization process after performing the annealing process to make a top surface of the contact plug levelled with top surfaces of the bit lines.

According to another embodiment of the present disclosure, a manufacturing method of a semiconductor structure is provided. A trench is formed between bit lines. A first source gas of $SiH_4$ and $PH_3$ is delivered to the trench to form a first contact layer. A second source gas of $SiH_4$ and $PH_3$ is delivered to the trench to form a second contact layer on the first contact layer, in which a first ratio of $PH_3$ to $SiH_4$ of the first source gas is higher than a second ratio of $PH_3$ to $SiH_4$ of the second source gas. A third source gas of $SiH_4$ and $PH_3$ is delivered to the trench to form a capping layer on the second contact layer. An annealing process is performed to form a contact plug from the first contact layer and the second contact layer.

In some embodiments, the first ratio of $PH_3$ to $SiH_4$ of the first source gas is higher than 0.3.

In some embodiments, a flow rate of the second source gas is higher than a flow rate of the first source gas.

In some embodiments, a third ratio of $PH_3$ to $SiH_4$ of the third source gas is lower than the second ratio of $PH_3$ to $SiH_4$ of the second source gas.

In some embodiments, the third ratio of $PH_3$ to $SiH_4$ of the third source gas is lower than 0.05.

In some embodiments, a flow rate of the second source gas is higher than a flow rate of the third source gas.

In some embodiments, forming the first contact layer, forming the second contact layer, and forming the capping layer are performed in-situ.

According to the above-mentioned embodiments, the manufacturing method of a semiconductor structure includes the annealing of a first contact layer having a higher doping concentration and a second contact layer having a lower doping concentration for one contact plug. Since the later formed second contact layer has lower doping concentration, the second contact layer may be formed with low surface roughness, which reduces the seam size and the voids in the contact plug.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart illustrating a manufacturing method of a semiconductor structure according to some embodiments of the present disclosure.

FIG. 2G is an enlarged cross-sectional view of an intermediate stage in the manufacturing of the semiconductor structure according to some embodiments of the present disclosure.

FIG. 3 is a cross-sectional view of an intermediate stage in the manufacturing of the semiconductor structure according to some embodiments of the present disclosure.

FIGS. 4A and 4B are cross-sectional views of various intermediate stages in the manufacturing of the semiconductor structure according to some embodiments of the present disclosure.

DETAILED DESCRIPTION

Figure 2A:
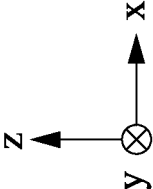
FIGS. 2A-2F and 2H are cross-sectional views of various intermediate stages in the manufacturing of the semiconductor structure according to some embodiments of the present disclosure.

The following disclosure provides many different embodiments, or examples, for implementing different features of the provided subject matter. Specific examples of components, values, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a manufacturing method of a semiconductor structure including depositing a first contact layer having a higher doping concentration, depositing a second contact layer having a lower doping concentration, and annealing the two contact layers to form a contact plug between the bit lines. Since the second contact layer has lower doping concentration, the second contact layer may be formed with lower surface roughness than the first contact layer. Therefore, the seam size and the voids are reduced in the contact plug.

According to some embodiments of the present disclosure, FIG. 1 is a flow chart illustrating a manufacturing method S100 of a semiconductor structure. As shown in FIG. 1, the method S100 includes the operation S110 to the operation S180. The details of the method S100 will be further described along with FIGS. 2A-2H. FIGS. 2A-2F and 2H illustrate cross-sectional views of various intermediate stages in the manufacturing of a semiconductor structure 10, and FIG. 2G illustrates an enlarged cross-sectional view of an intermediate stage in the manufacturing of the semiconductor structure 10.

It should be noted that, unless otherwise stated, when FIGS. 2A-2H show or illustrate a series of steps of the embodiments, the description sequence of these steps should not be limited. For example, some steps may be taken in a different order than the described embodiments, some steps may occur simultaneously, some steps may not be required, and/or some steps may be repeated. In addition, additional steps may be performed before, during, or after the illustrated steps to completed form the circuit board.

In order to describe elements included in the semiconductor structure 10, FIGS. 2A-2H merely show some elements of the semiconductor structure 10, but a semiconductor structure 10 including additional elements (for example, a word line, a landing pad, etc.) also fall within the scope of the present disclosure.

Referring to FIG. 1 and FIG. 2A, in the operation S110 of the method S100, bit lines 130 are formed on a substrate 100. Specifically, the bit lines 130 include several material layers stacked along z-axis direction on the top surface of the substrate 100. The bit lines 130 are distanced from each other in x-axis direction, while each of the bit line 130 extends along y-axis direction on the substrate 100.

In some embodiments, the substrate 100 may be a bulk semiconductor, a semiconductor-on-insulator (SOI), or other semiconductor substrate. The semiconductor material included in the substrate 100 may be Si, Ge, compound semiconductor, alloy semiconductor, or combinations thereof. The substrate 100 may be undoped or doped with dopants. The substrate 100 may further include polysilicon bit lines 110 and polysilicon bit lines 120 therein as conductive paths. For example, as shown in FIG. 2A, the polysilicon bit lines 110 and polysilicon bit lines 120 may be disposed under and electrically connected to the bit lines 130 to transport the current to the bit lines 130.

In some embodiments, the bit line 130 may include a dielectric layer 132 on the top surface of the substrate 100, a first conductive layer 134 on the dielectric layer 132, a second conductive layer 136 on the first conductive layer 134, and an isolation layer 138 on the second conductive layer 136. The dielectric layer 132 and the isolation layer 138 may be formed of silicon oxide, silicon nitride, high-k dielectric material, combinations thereof or the like to isolate other layers of the bit line 130 from the substrate 100 and the elements above the bit line 130.

The first conductive layer 134 and the second conductive layer 136 may be formed of polysilicon, metal, metal nitride, metal silicide, combinations thereof or the like, so that a combination of the first conductive layer 134 and the second conductive layer 136 may be configured as a gate structure of the bit line 130. In the embodiments which at least one of the first conductive layer 134 and the second conductive layer 136 includes metal or metal compounds, the bit line 130 may be referred as a metal bit line.

In some embodiments, a bit line spacer 140 may be formed on the sidewalls of the bit lines 130 to protect the bit lines 130 in the following manufacturing process. The bit line spacer 140 may conformally cover the sidewalls of the bit line 130. In some cases, the bit line spacer 140 may further extend from the sidewalls of the bit line 130 into the substrate 100. The bit line spacer 140 may be a single layer or multilayer of silicon nitride, low-k dielectric layer, other suitable dielectric layers, or combinations thereof.

Figure 2B:
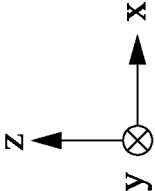

Referring to FIG. 1 and FIG. 2B, in the operation S120 of the method S100, a trench 150 is formed between the bit lines 130. Specifically, the substrate 100 between the adjacent two bit lines 130 is etched so that the etched surface of the substrate 100 is lower than a bottom surface of the bit line 130. As a result, the trench 150 is formed between the adjacent two bit lines 130, and the trench 150 has a bottom surface lower than bottom surface of the bit line 130.

In some embodiments, the substrate 100 may be etched along the bit line spacer 140 on the sidewalls of the bit line 130, leading to the trench 150 exposing the bit line spacer 140. In such embodiments, the width of the trench 150 in x-axis direction may be equal to the distance between the bit line spacers 140 on the adjacent two bit lines 130. In some embodiments, the bottom surface of the trench 150 may have a curved shape as shown in FIG. 2B, but in other embodiments, the bottom surface of the trench 150 may have a linear shape along x-axis direction or other shapes for the later formed contact plug (referring to the contact plug 200 of the semiconductor structure 10 shown in FIG. 2H).

Figure 2C:
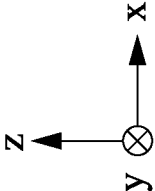

Referring to FIG. 1 and FIG. 2C, in the operation S130 of the method S100, a seed layer 160 is formed in the trench 150. Specifically, a polysilicon material is deposited onto the structure shown in FIG. 2B by, such as, chemical vapor deposition (CVD). The deposited polysilicon material covers the bottom surface and the sidewalls of the trench 150, which forms the seed layer 160. The seed layer 160 may also cover the top surface of the bit line 130, so that the seed layer 160 continuously covers the bit line 130, the bit line spacer 140, and the surface of the trench 150. After the deposition of the seed layer 160, a portion of the trench 150 is remained above the seed layer 160.

The polysilicon material of the seed layer 160 is undoped. Since the seed layer 160 does not include dopants, the seed layer 160 shows a low surface roughness after the deposition. Therefore, the seed layer 160 in the trench 150 provides a smooth surface for the following deposition.

In some embodiments, the thickness of the seed layer 160 may be so thin that it conformally covers the surface of the trench 150. For example, a thickness of the seed layer 160 in the trench 150 may be in a range of 1.0 nm to 1.5 nm. If the thickness of the seed layer 160 is smaller than 1.0 nm, the seed layer 160 may be too thin to provide the smooth surface exposed in the trench 150. If the thickness of the seed layer 160 is larger than 1.5 nm, the deposition of the seed layer 160 may cost too much time and material without significant improvement of the surface roughness of the seed layer 160.

Figure 2D:
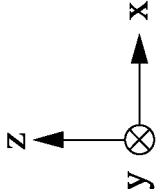

Referring to FIG. 1 and FIG. 2D, in the operation S140 of the method S100, a first contact layer 170 is formed on the seed layer 160. Specifically, a polysilicon material is deposited onto the structure shown in FIG. 2C by, such as, chemical vapor deposition. The deposited polysilicon material covers the seed layer 160, which forms the first contact layer 170. Since the seed layer 160 provides the smooth surface for depositing the first contact layer 170, the roughness of the first contact layer 170 may also be reduced. As shown in FIG. 2D, the first contact layer 170 may continuously cover the seed layer 160 in the trench 150 and the seed layer 160 on the top surface of the bit line 130. After the deposition of the first contact layer 170, a portion of the trench 150 is remained above the first contact layer 170.

Compared to the seed layer 160, the polysilicon material of the first contact layer 170 is doped with dopants. For example, the seed layer 160 and the first contact layer 170 may include the same polysilicon, while the first contact layer 170 is doped with n-type dopants such as phosphorus. More specifically, the first contact layer 170 has a doping concentration near or higher than an expected doping concentration of the later formed contact plug. The first contact layer 170 having such doping concentration acts as a source of the dopants for the later formed contact plug. In some embodiments which the expected doping concentration of the contact plug is about $1 \times 10^{21}$ cm$^{-3}$, the doping concentration of the first contact layer 170 may be in a range of $1 \times 10^{21}$ cm$^{-3}$ to $5 \times 10^{21}$ cm$^{-3}$.

In some embodiments, the deposition of the first contact layer 170 and the seed layer 160 may be performed in-situ. For example, the seed layer 160 may first be deposited by delivering a source gas SiH$_4$ into the trench 150. After the formation of the seed layer 160, a mixed source gas of SiH$_4$ and PH$_3$ is delivered in the same chamber to form the first contact layer 170 on the seed layer 160. The ratio of PH$_3$ to SiH$_4$ may be higher than 0.3 to form the first contact layer 170 with high doping concentration. The concentration of SiH$_4$ is higher than that of PH$_3$ in the mixed source gas so that the main composition of the first contact layer 170 remains polysilicon.

In some embodiments, a thickness of the first contact layer 170 may be larger than that of the seed layer 160. If the thickness of the first contact layer 170 is smaller than that of the seed layer 160, the first contact layer 170 may be too thin to act as the dopant source for the later formed contact plug. However, the thickness of the first contact layer 170 is controlled to remain a portion of the trench 150 after the deposition of the first contact layer 170. As shown in FIG. 2D, the first contact layer 170 may be thin enough to conformally cover the seed layer 160. In the embodiments which a width of the trench 150 in x-axis direction is about 45 nm, a thickness of the first contact layer 170 in the trench 150 may be in a range of 5.5 nm to 9.5 nm.

Figure 2E:
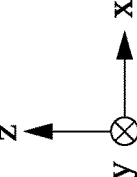

Referring to FIG. 1 and FIG. 2E, in the operation S150 of the method S100, a second contact layer 180 is formed on the first contact layer 170 to fill the trench 150. Specifically, a polysilicon material is deposited onto the structure shown in FIG. 2D by, such as, chemical vapor deposition. The deposited polysilicon material covers the first contact layer 170, which forms the second contact layer 180. As shown in FIG. 2E, the second contact layer 180 fills the remained portion of the trench 150. The deposited second contact layer 180 covers the first contact layer 170 in the trench 150 and extends onto the first contact layer 170 above the top surface of the bit line 130.

More specifically, the deposition of the second contact layer 180 in the trench 150 starts from the surface of the first contact layer 170. As the deposition proceeds, the material of the second contact layer 180 on the sidewalls of the trench 150 grows thicker toward the center of the trench 150. When the material of the second contact layer 180 on the opposite sidewalls of the trench 150 contacts at an interface 180a shown in FIG. 2E, the trench is filled with the second contact layer 180. It should be noted that the interface 180a is illustrated for the detailed description of the deposition of the second contact layer 180, and such interface 180a may not be observed in the second contact layer 180.

In some embodiments, the second contact layer 180 is conformal with the first contact layer 170, so that a portion of the second contact layer 180 deposited conformally with the corner of the bit line 130 forms a recessed portion 180b. The recessed portion 180b appears at the top surface of the second contact layer 180, and the bottommost of the recessed portion 180b is aligned with the interface 180a along z-axis direction.

Like the first contact layer 170, the second contact layer 180 is also doped with dopants. Although the first contact layer 170 and the second contact layer 180 are both doped, the doping concentration of the second contact layer 180 is lower than that of the first contact layer 170. Since the second contact layer 180 has lower doping concentration, the second contact layer 180 may fill the trench 150 with low surface roughness. As a result, the size of seam formed at the interface 180$a$ is reduced. In other words, depositing the second contact layer 180 with the lower doping concentration reduces the voids in the second contact layer 180. In some embodiments which the doping concentration of the first contact layer 170 is in a range of $1\times10^{21}$ cm$^{-3}$ to $5\times10^{21}$ cm$^{-3}$, the doping concentration of the second contact layer 180 may be in a range of $4\times10^{20}$ cm$^{-3}$ to $5\times10^{20}$ cm$^{-3}$.

As mentioned above, the seed layer 160 is deposited without dopants, the first contact layer 170 is deposited with a high doping concentration, and the second contact layer 180 is deposited with a doping concentration lower than that of the first contact layer 170. After the formation of the second contact layer 180, the trench 150 is filled by the seed layer 160, the first contact layer 170, and the second contact layer 180. Therefore, by measuring along x-axis direction, the doping concentration rises from the interface 180$a$ to the first contact layer 170 and drops from the first contact layer 170 to the seed layer 160.

In some embodiments, the first contact layer 170 and the second contact layer 180 may be formed of the same polysilicon and include the same dopants. Therefore, the deposition of the second contact layer 180 and the first contact layer 170 can be performed in-situ. For example, the first contact layer 170 may first be deposited by delivering a mixed source gas of SiH$_4$ and PH$_3$ into the trench 150. After the formation of the first contact layer 170, the ratio of PH$_3$ to SiH$_4$ of the mixed source gas may be adjusted to a lower value in the same chamber to form the second contact layer 180 on the first contact layer 170. In the embodiments which the ratio of PH$_3$ to SiH$_4$ for forming the first contact layer 170 is higher than 0.3, the ratio of PH$_3$ to SiH$_4$ for forming the second contact layer 180 may be between 0.05 and 0.3. As a result, the doping concentration of the second contact layer 180 is lower than that of the first contact layer 170.

In addition, a flow rate of the source gas for forming the second contact layer 180 may be higher than a flow rate of the source gas for forming the first contact layer 170. The high flow rate for forming the second contact layer 180 contributes to the intact deposition of the second contact layer 180 from the bottom of the trench 150, thereby reducing the risk of void formation at the bottom of the second contact layer 180.

In some embodiments, a thickness of the second contact layer 180 may be larger than that of the first contact layer 170. Referring to FIG. 2E, the thickness of the second contact layer 180 herein is defined as the distance D1 between the surface of first contact layer 170 and the interface 180$a$ in x-axis direction, and the thickness of the first contact layer 170 is the distance D2 between the seed layer 160 and the second contact layer 180 in x-axis direction. A ratio of the thickness of the second contact layer 180 to that of the first contact layer 170 may be in a range of 1.3 to 3.1. If the ratio is smaller than 1.3, the size of the seam or the numbers of the voids may be increased in the second contact layer 180. If the ratio is larger than 3.1, the first contact layer 170 may not provide sufficient dopants for the later formed contact plug. In the embodiments which a thickness (i.e., distance D2 in FIG. 2E) of the first contact layer 170 is about 5.5 nm to about 9.5 nm, a thickness (i.e., distance D1 in FIG. 2E) of the second contact layer 180 in the trench 150 may be in a range of 13 nm to 17 nm.

Figure 2F:
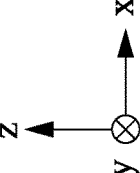

Referring to FIG. 1 and FIG. 2F, in the operation S160 of the method $100, a capping layer 190 is formed on the second contact layer 180. Specifically, a polysilicon material is deposited onto the structure shown in FIG. 2E by, such as, chemical vapor deposition. The deposited polysilicon material covers the second contact layer 180, which forms the capping layer 190. After the deposition, the capping layer 190 has a flat top surface suitable for the later planarization process.

In the embodiments which the second contact layer 180 has the recessed portion 180$b$, the capping layer 190 fills the recessed portion 180$b$ and provides the flat top surface. The capping layer 190 may be doped with a doping concentration lower than those of the first contact layer 170 and the second contact layer 180. Since the capping layer 190 has low doping concentration, the capping layer 190 may fill the recessed portion 180$b$ with a low surface roughness. As a result, the risk of void formation between the second contact layer 180 and the capping layer 190 may be reduced. In some embodiments which the doping concentration of the second contact layer 180 is in a range of $4\times10^{20}$ cm$^{-3}$ to $5\times10^{20}$ cm$^{-3}$, the doping concentration of the capping layer 190 may be in a range of $1\times10^{20}$ cm$^{-3}$ to $2\times10^{20}$ cm$^{-3}$.

In some embodiments, the second contact layer 180 and the capping layer 190 may include the same polysilicon and dopants. Therefore, the deposition of the capping layer 190 and the second contact layer 180 can be performed in-situ. For example, the second contact layer 180 may first be deposited by delivering a mixed source gas of SiH$_4$ and PH$_3$ into the trench 150. After the formation of the second contact layer 180, the ratio of PH$_3$ to SiH$_4$ of the mixed source gas is adjusted to a lower value in the same chamber to form the capping layer 190 on the second contact layer 180. In the embodiments which the ratio of PH$_3$ to SiH$_4$ for forming the second contact layer 180 is between 0.05 and 0.3, the ratio of PH$_3$ to SiH$_4$ for forming the capping layer 190 may be lower than 0.05. As a result, the doping concentration of the capping layer 190 is lower than that of the second contact layer 180.

In addition, a flow rate of the source gas for forming the capping layer 190 may be lower than a flow rate of the source gas for forming the second contact layer 180. Since the recessed portion 180$b$ filled by the capping layer 190 is smaller than the trench 150 filled by the second contact layer 180, the capping layer 190 formed by a lower flow rate may still reduce the risk of void formation at the bottom of the capping layer 190.

In some embodiments, a thickness of the capping layer 190 may be larger than that of the second contact layer 180 to provide the flat top surface. For example, the thickness of the capping layer 190 may be near or equal to the width of the trench 150 in x-axis direction.

Referring to FIG. 1 and FIG. 2G, in the operation S170 of the method S100, an annealing process is performed on the first contact layer 170 and the second contact layer 180 to form the contact plug 200. During the annealing process, the dopants in the first contact layer 170 diffuse into the adjacent second contact layer 180. As a result, the doping concentration of the second contact layer 180 is increased. Since the first contact layer 170 has a high doping concentration before annealing, the first contact layer 170 and the second contact layer 180 form the contact plug 200 with a high doping concentration after the annealing process.

To clearly describe the diffusion of the dopants, FIG. 2G illustrates the enlarged cross-sectional view taken from the region A in FIG. 2F. As shown in FIG. 2G, the first contact layer 170 having higher doping concentration is served as the dopant source for the second contact layer 180. When the first contact layer 170 and the second contact layer 180 receive the heating from the annealing process, the dopants in the first contact layer 170 diffuses toward the second contact layer 180 along the illustrated arrows in x-axis direction.

It should be noted that the dopants in the first contact layer 170 may also diffuse toward the seed layer 160 along the illustrated arrows in x-axis direction. Since the thickness of the second contact layer 180 is larger than the thickness of the seed layer 160, the diffusion of the dopants is mainly toward the second contact layer 180. In some other embodiments, the dopants in the first contact layer 170 may diffuse into the capping layer 190 along z-axis direction. Since the contact area between the first contact layer 170 and the second contact layer 180 is larger than that of between the first contact layer 170 and the capping layer 190, the diffusion of the dopants is mainly toward the second contact layer 180 along x-axis direction.

After the annealing process, the doping concentrations of the seed layer 160, the first contact layer 170, and the second contact layer 180 may be similar. Preferably, the seed layer 160, the first contact layer 170, and the second contact layer 180 may have a uniform doping concentration. As the seed layer 160, the first contact layer 170, and the second contact layer 180 are formed of the same polysilicon material, the interfaces between any two of the layers may not be significant after the annealing process. Therefore, the seed layer 160, the first contact layer 170, and the second contact layer 180 may be considered as one contact plug 200. Since the doping concentration of the first contact layer 170 is near or higher than the expected doping concentration of the contact plug 200, the contact plug 200 formed by the seed layer 160, the first contact layer 170, and the second contact layer 180 may achieve the expected doping concentration after the annealing process.

Figure 2H:
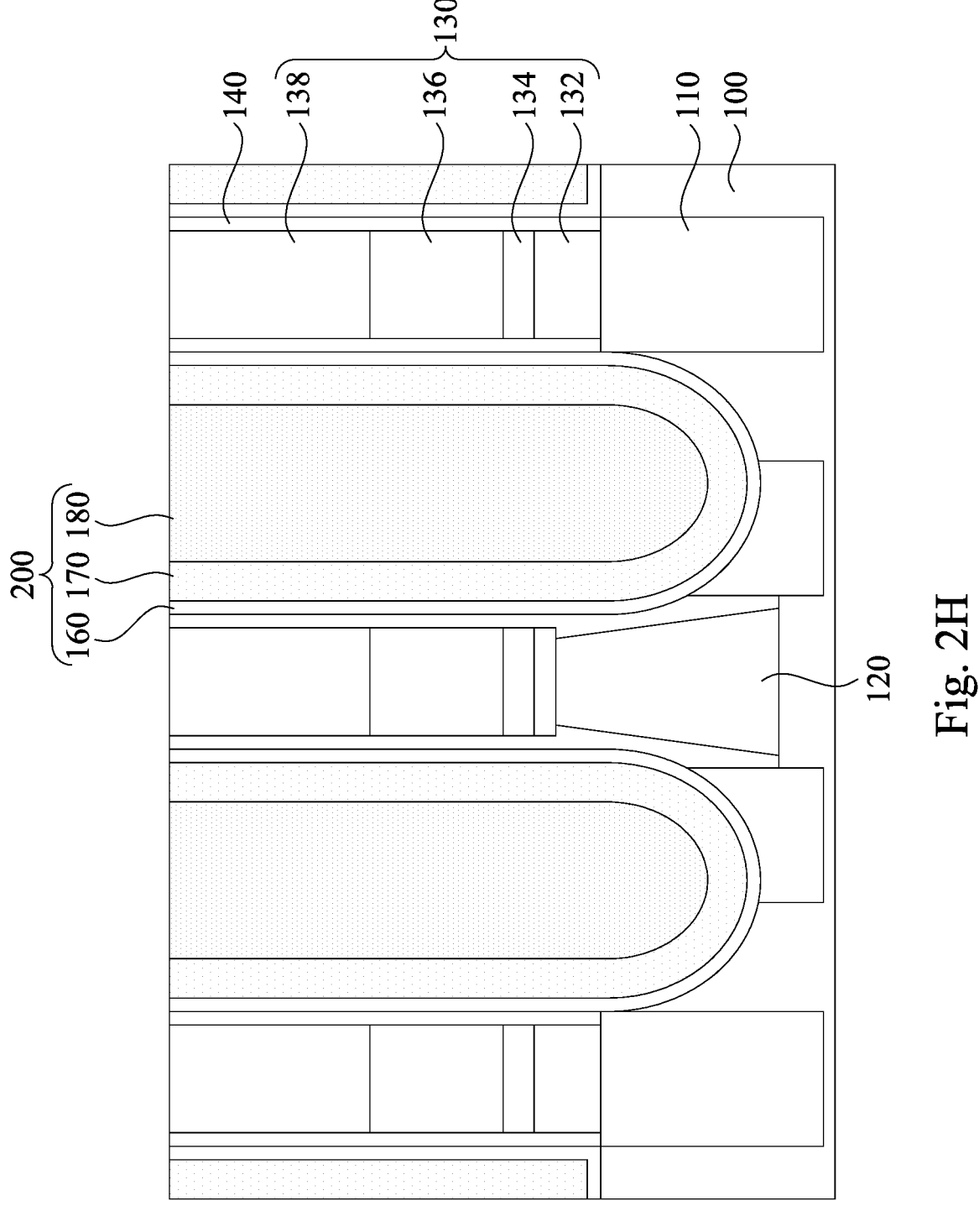

Referring to FIG. 1 and FIG. 2H, in the operation S180 of the method S100, a planarization process is performed to form the semiconductor structure 10. Specifically, the planarization process, such as chemical mechanical polishing (CMP), is performed to make a top surface of the contact plug 200 levelled with the top surface of the bit line 130. After the planarization process, the semiconductor structure 10 including the bit lines 130 and the contact plug 200 is formed. The contact plug 200 formed by the method S100 has lower risk of seam or void formation therein, which improves the yield and performance of the semiconductor structure 10.

In some embodiments, as shown in FIG. 2H, the capping layer 190 in FIG. 2F may be removed by the planarization process. In some other embodiments, the capping layer 190 may not be totally removed from the semiconductor structure. For example, FIG. 3 illustrates a cross-sectional view of an intermediate stage in the manufacturing of the semiconductor structure 20 according to some embodiments of the present disclosure. The process for forming the semiconductor structure 20 is similar to the process for forming the semiconductor structure 10 in FIG. 2H, except for the additional partial removing steps of the deposited layers.

Specifically, to form the semiconductor structure 20, a portion of the seed layer 160 on the top surface of the bit line 130 is removed before forming the first contact layer 170. Similarly, a portion of the first contact layer 170 on the top surface of the bit line 130 is removed before depositing the second contact layer 180. After the second contact layer 180 fills the trench, the recessed portion 180b of the second contact layer 180 is lower than the top surface of the bit line 130. The capping layer 190 then fills the recessed portion 180b, so that the capping layer 190 in the recessed portion 180b is lower than the top surface of the bit line 130. As a result, the capping layer 190 in the recessed portion 180b may be remained in the semiconductor structure 20 after the planarization process. In such embodiments, the seed layer 160, the first contact layer 170, the second contact layer 180, and the remained capping layer 190 may be considered as the contact plug 200.

Figure 4A:
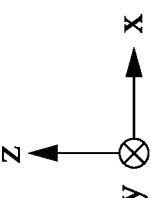

The contact plug 200 with reduced seam size and void amounts is beneficial for further processing of the semiconductor structure 10. For example, FIGS. 4A and 4B illustrate the cross-sectional views of the semiconductor structure 10 in the intermediate stages of manufacturing after FIG. 2H. Referring to FIGS. 4A and 4B, the top surface of the contact plug 200 is first recessed to the position lower than the top surface of the bit line 130. A silicide layer 210 is then formed on the top surface of the contact plug 200. In some embodiments, the formation of the silicide layer 210 may include depositing a metal layer onto the top surface of the contact plug 200 and performing an annealing process on the metal layer. During the annealing process, the metal layer reacts with the contact plug 200 and forms the silicide layer 210.

Since the contact plug 200 has reduced seam size and void amounts, the possibility of void formation in the silicide layer 210 is significantly reduces. This decreases the risk of cracking of the silicide layer 210. Therefore, the silicide layer 210 can protect the contact plug 200 from the materials above the silicide layer 210, such as the metal of the landing pad for the contact plug 200. In other words, the improved structure integrity of the contact plug 200 allows the semiconductor structure 10 to be further processed under a higher yield.

According to the above-mentioned embodiments of the present disclosure, a manufacturing method of a semiconductor structure includes depositing a first contact layer and a second contact layer, and annealing the contact layers for dopant diffusion between the two contact layers. The first contact layer having a higher doping concentration acts as a dopant source for the contact plug. The second contact layer having a lower doping concentration is formed with a lower surface roughness than the first contact layer, which reduces the seam size and the voids in the contact plug. Therefore, the yield and the performance of the semiconductor structure including the contact plus are improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor structure, comprising:

forming a trench between bit lines;

depositing a seed layer in the trench;

depositing a first contact layer on the seed layer in the trench;

depositing a second contact layer on the first contact layer to fill the trench, wherein a second doping concentration of the second contact layer is lower than a first doping concentration of the first contact layer;

depositing a capping layer on the second contact layer after depositing the second contact layer, wherein a third doping concentration of the capping layer is lower than the second doping concentration of the second contact layer; and performing an annealing process on the first contact layer and the second contact layer, such that dopants in the first contact layer diffuse into the second contact layer to form a contact plug comprising the first contact layer and the second contact layer.

2. The manufacturing method of claim 1, wherein the first doping concentration of the first contact layer before performing the annealing process is higher than a doping concentration of the contact plug after performing the annealing process.

3. The manufacturing method of claim 1, wherein the seed layer is undoped before performing the annealing process.

4. The manufacturing method of claim 3, wherein after performing the annealing process, the dopants in the first contact layer diffuse into the seed layer to form the contact plug comprising the seed layer.

5. The manufacturing method of claim 1, wherein the seed layer, the first contact layer, and the second contact layer have a uniform doping concentration after performing the annealing process.

6. The manufacturing method of claim 1, wherein a thickness of the first contact layer is larger than a thickness of the seed layer, and wherein a thickness of the second contact layer is larger than the thickness of the first contact layer.

7. The manufacturing method of claim 1, wherein a ratio of a thickness of the second contact layer to a thickness of the first contact layer is in a range of 1.3 to 3.1.

8. The manufacturing method of claim 1, wherein the seed layer, the first contact layer, and the second contact layer are formed of a same polysilicon material.

9. The manufacturing method of claim 1, wherein the second contact layer comprises a recessed portion at a top surface of the second contact layer, and wherein the capping layer fills the recessed portion.

10. The manufacturing method of claim 1, wherein the capping layer has a flat top surface after depositing the capping layer.

11. The manufacturing method of claim 1, wherein a thickness of the capping layer is larger than a thickness of the second contact layer.

12. The manufacturing method of claim 1, further comprising:

performing a planarization process after performing the annealing process to make a top surface of the contact plug levelled with top surfaces of the bit lines.

13. A manufacturing method of a semiconductor structure, comprising:

forming a trench between bit lines;

delivering a first source gas of $SiH_4$ and $PH_3$ to the trench to form a first contact layer;

delivering a second source gas of $SiH_4$ and $PH_3$ to the trench to form a second contact layer on the first contact layer, wherein a first ratio of $PH_3$ to $SiH_4$ of the first source gas is higher than a second ratio of $PH_3$ to $SiH_4$ of the second source gas;

delivering a third source gas of $SiH_4$ and $PH_3$ to the trench to form a capping layer on the second contact layer; and performing an annealing process to form a contact plug from the first contact layer and the second contact layer.

14. The manufacturing method of claim 13, wherein the first ratio of $PH_3$ to $SiH_4$ of the first source gas is higher than 0.3.

15. The manufacturing method of claim 13, wherein a flow rate of the second source gas is higher than a flow rate of the first source gas.

16. The manufacturing method of claim 13, wherein a third ratio of $PH_3$ to $SiH_4$ of the third source gas is lower than the second ratio of $PH_3$ to $SiH_4$ of the second source gas.

17. The manufacturing method of claim 13, wherein a third ratio of $PH_3$ to $SiH_4$ of the third source gas is lower than 0.05.

18. The manufacturing method of claim 13, wherein a flow rate of the second source gas is higher than a flow rate of the third source gas.

19. The manufacturing method of claim 13, wherein forming the first contact layer, forming the second contact layer, and forming the capping layer are performed in-situ.

* * * * *